United States Patent
Chen

(10) Patent No.: US 9,502,349 B2
(45) Date of Patent: Nov. 22, 2016

(54) SEPARATED LOWER SELECT LINE IN 3D NAND ARCHITECTURE

(71) Applicant: MACRONIX INTERNATIONAL CO., LTD., Hsinchu (TW)

(72) Inventor: Shih-Hung Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 138 days.

(21) Appl. No.: 14/640,869

(22) Filed: Mar. 6, 2015

(65) Prior Publication Data

US 2016/0260663 A1   Sep. 8, 2016

(51) Int. Cl.
  *H01L 27/115*  (2006.01)
  *H01L 23/528*  (2006.01)

(52) U.S. Cl.
  CPC ....... *H01L 23/528* (2013.01); *H01L 27/11582* (2013.01)

(58) Field of Classification Search
  CPC .................. H01L 27/1157; H01L 27/11578; H01L 27/1158; H01L 27/11582; G11C 16/0466; G11C 16/0483
  See application file for complete search history.

(56) References Cited

U.S. PATENT DOCUMENTS

| | | |
|---|---|---|
| 6,906,940 B1 | 6/2005 | Lue |
| 7,315,474 B2 | 1/2008 | Lue |
| 7,420,242 B2 | 9/2008 | Lung |
| 7,696,559 B2 | 4/2010 | Arai et al. |
| 7,851,849 B2 | 12/2010 | Kiyotoshi |
| 8,008,732 B2 | 8/2011 | Kiyotoshi et al. |
| 8,363,476 B2 | 1/2013 | Lue et al. |
| 8,467,219 B2 | 6/2013 | Lue |
| 8,503,213 B2 | 8/2013 | Chen et al. |
| 8,648,438 B2 | 2/2014 | Cai et al. |
| 8,759,899 B1 | 6/2014 | Lue et al. |
| 8,853,818 B2 | 10/2014 | Lue |
| 9,196,364 B2 * | 11/2015 | Kim ........................ G11C 16/08 |
| 9,280,420 B2 * | 3/2016 | Yoon .................... G06F 11/1008 |
| 2005/0280061 A1 | 12/2005 | Lee |

(Continued)

FOREIGN PATENT DOCUMENTS

| | | |
|---|---|---|
| EP | 2048709 A2 | 4/2009 |
| TW | 201436193 | 9/2014 |

OTHER PUBLICATIONS

Bae, JH, "Samsung's 3D V-NAND breaks through chip scaling limits", http://itersnews.com, dated Feb. 14, 2014, 5 pages.

(Continued)

*Primary Examiner* — Allison P Bernstein
(74) *Attorney, Agent, or Firm* — Haynes Beffel & Wolfeld LLP

(57) ABSTRACT

Roughly described, a memory device has a multilevel stack of conductive layers which are divided laterally into separate word lines, each defining a block of memory cells. Vertically oriented pillars each include series-connected memory cells at cross-points between the pillars and the conductive layers. String select lines run above the conductive layers, each intersection of a pillar and an string select line defining a respective select gate of the pillar. Bit lines run above the SSLs. Ground select lines run below the conductive layers, each intersection of a pillar and a ground select line defining a respective ground select gate of the pillar. The ground select lines are divided laterally such that the number of ground select lines in each block is greater than 1 but less than the number of string select lines in the block.

18 Claims, 10 Drawing Sheets

(56) References Cited

U.S. PATENT DOCUMENTS

| | | |
|---|---|---|
| 2007/0045708 A1 | 3/2007 | Lung |
| 2007/0158736 A1 | 7/2007 | Arai et al. |
| 2007/0252201 A1 | 11/2007 | Kito et al. |
| 2008/0073635 A1 | 3/2008 | Kiyotoshi et al. |
| 2008/0175032 A1 | 7/2008 | Tanaka et al. |
| 2008/0180994 A1 | 7/2008 | Katsumata et al. |
| 2009/0097321 A1 | 4/2009 | Kim et al. |
| 2009/0184360 A1 | 7/2009 | Jin et al. |
| 2010/0270593 A1 | 10/2010 | Lung et al. |
| 2011/0018051 A1 | 1/2011 | Kim et al. |
| 2012/0007167 A1 | 1/2012 | Hung et al. |
| 2012/0068241 A1 | 3/2012 | Sakuma et al. |
| 2012/0119283 A1 | 5/2012 | Lee et al. |
| 2012/0182806 A1 | 7/2012 | Chen et al. |
| 2014/0140131 A1 | 5/2014 | Yeh et al. |
| 2015/0105639 A1 | 4/2015 | Watanabe |
| 2015/0206896 A1 | 7/2015 | Chen |
| 2015/0206898 A1 | 7/2015 | Chen |
| 2015/0206899 A1 | 7/2015 | Chen |

OTHER PUBLICATIONS

Chen, et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012. 91-92.

Chen, et al., "Highly Scalable Vertical Gate 3-D NAND", 2012 IEEE International Electron Devices Meeting (IEDM), Feb. 4, 2013, 9 pages.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Das, Arabinda, "Samsung 2x nm LPDDR3 DRAM Scales Memory Wall", EE Times, http://www.eetimes.com/author.asp?section id+36&eoc id+1321629&print=yes, dated Mar. 25, 2014, 6 pages.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung, et al., "A highly scalable vertical gate (VG) 3D NAND Flash with robust program disturb immunity using a novel PN diode decoding structure," 2011 Symp. on VLSI Technology (VLSIT), Jun. 14-16, 2011, 2 pages.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata, et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Komori, et al., "Disturbless Flash Memory due to High Boost Efficiency on BiCS Structure and Optimal Memory Film Stack for Ultra High Density Storage Device", Electron Devices Meeting, IEDM 2008, IEEE International, Dec. 15-17, 2008, San Francisco, California, 4 pages.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue, et al., "A highly scalable 8-layer 3D vertical-gate (VG) TFT NAND Flash using junction-free buried channel BE-SONOS device," 2010 Symposium on VLSI Technology (VLSIT), Jun. 15-17, 2010, 2 pages.

Nowak, et al., "Intrinsic fluctuations in Vertical NAND flash memories," VLSI Technology (VLSIT), 2012 Symposium on , vol., No., pp. 21,22, Jun. 12-14, 2012.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

U.S. Appl. No. 14/309,622, filed Jun. 19, 2014, entitled "Bandgap-engineered Memory With Multiple Charge Trapping Layers Storing Charge," by Hang-Ting Lue, 108 pages.

U.S. Appl. No. 14/471,788, filed Aug. 28, 2014, entitled "Multiple-Bit-Per-Cell, Independent Double Gate, Vertical Channel Memory," by Hang-Ting Lue, 79 pages.

U.S. Appl. No. 14/637,187, filed Mar. 3, 2015, 90 pages.

U.S. Appl. No. 14/637,204, filed Mar. 3, 2015, entitled "U-Shaped Vertical Thin-Channel Memory," by Hang-Ting Lue, 78 pages.

Wang, Michael, "Technology Trends on 3D-NAND Flash Storage", Impact 2011, Taipei, dated Oct. 20, 2011, found at 222.impact.org.tw/2011/files/newsfile/201111110190.pdf.

* cited by examiner

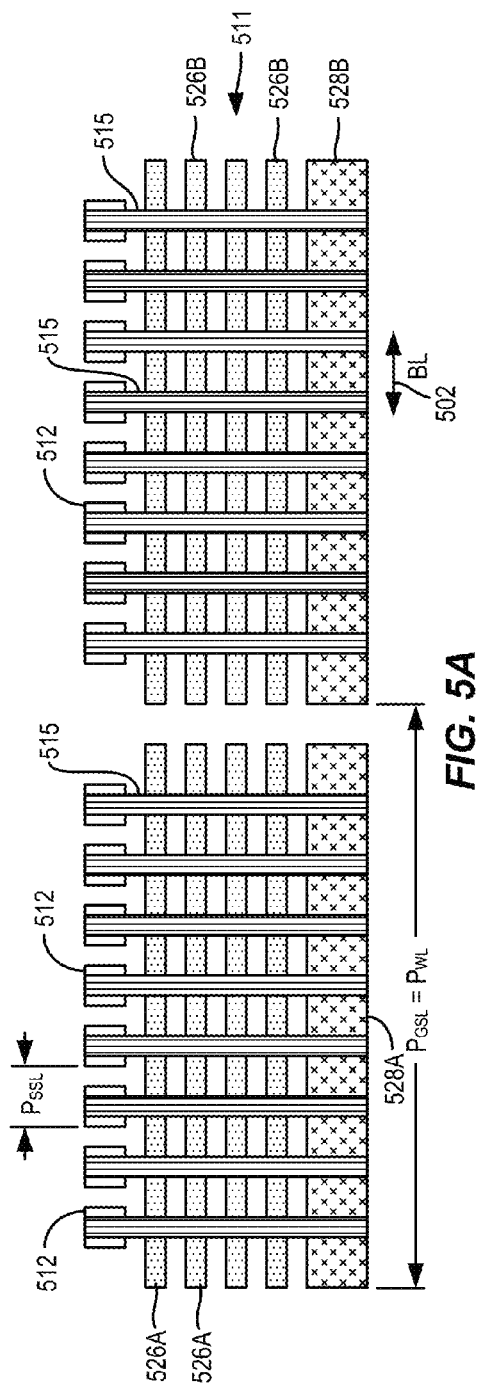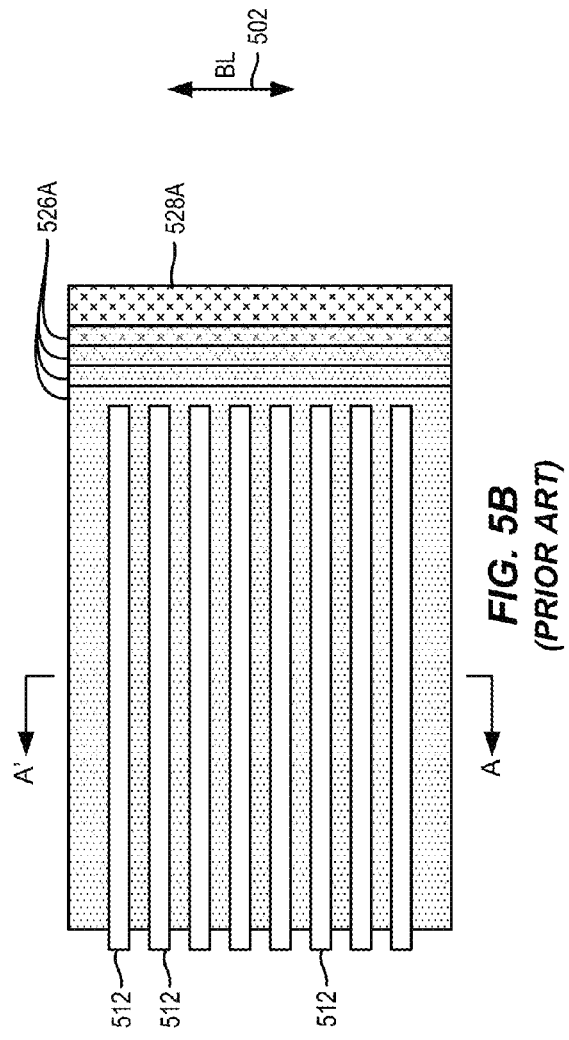
FIG. 5A (PRIOR ART)
FIG. 5B (PRIOR ART)

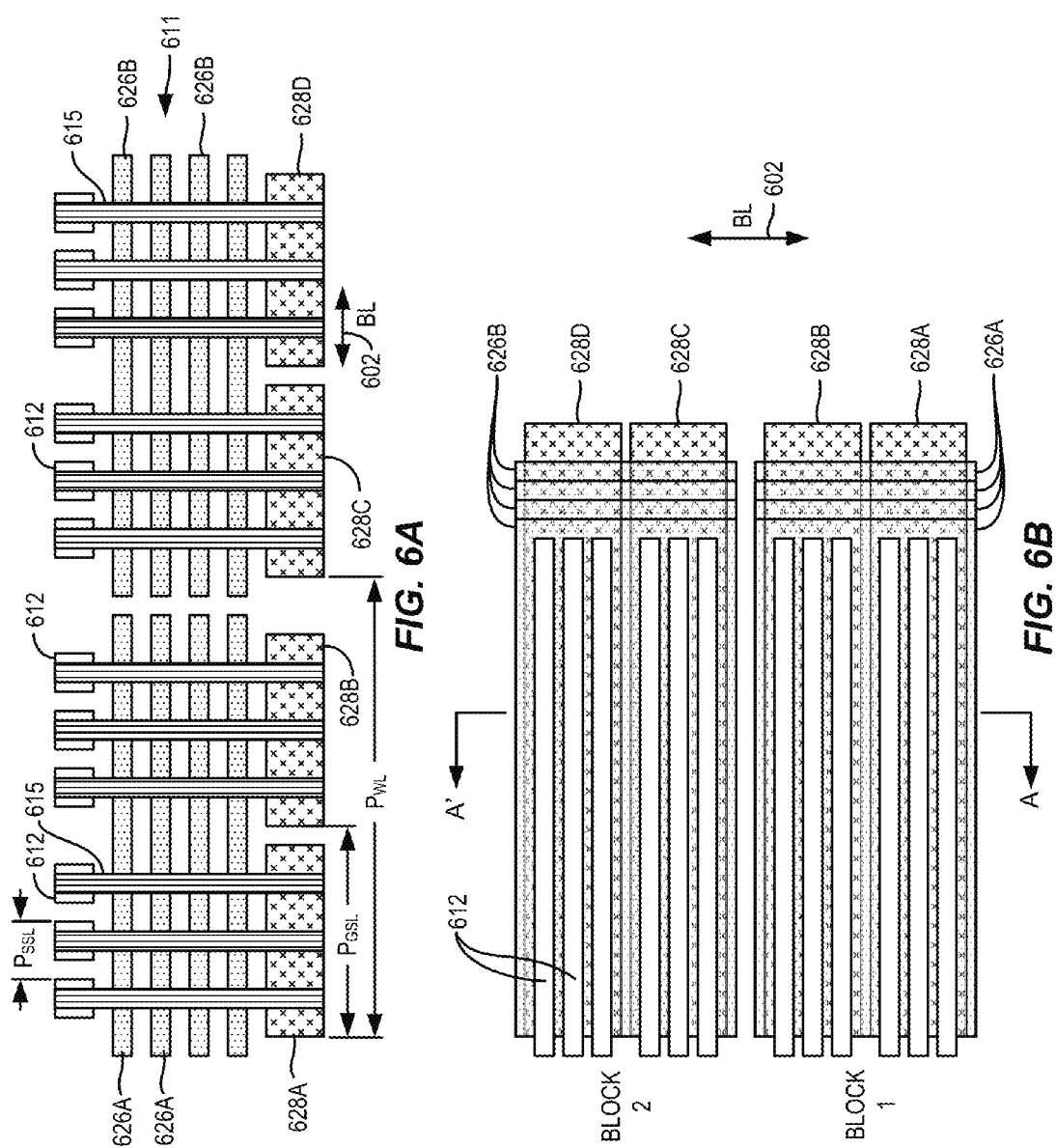

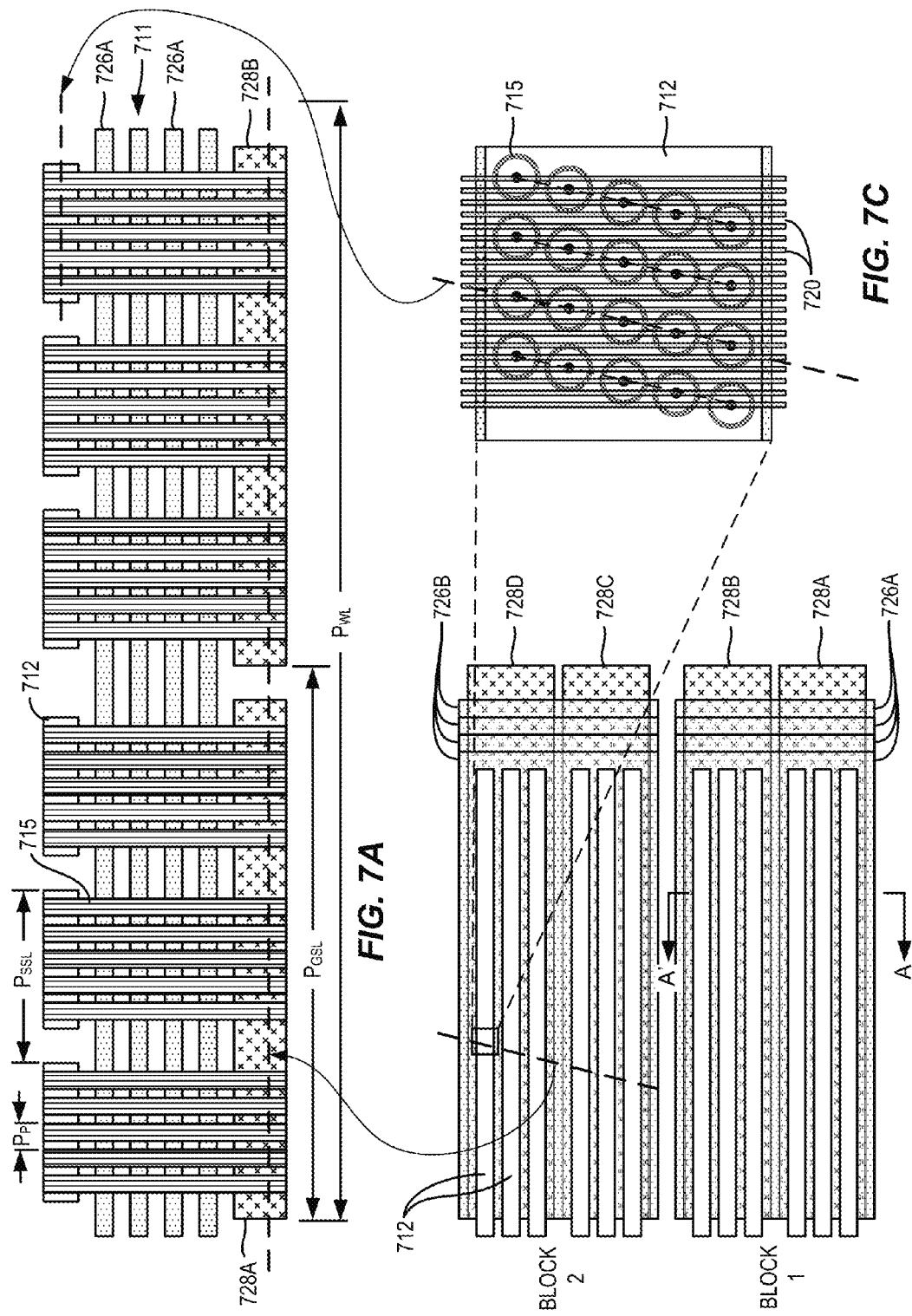

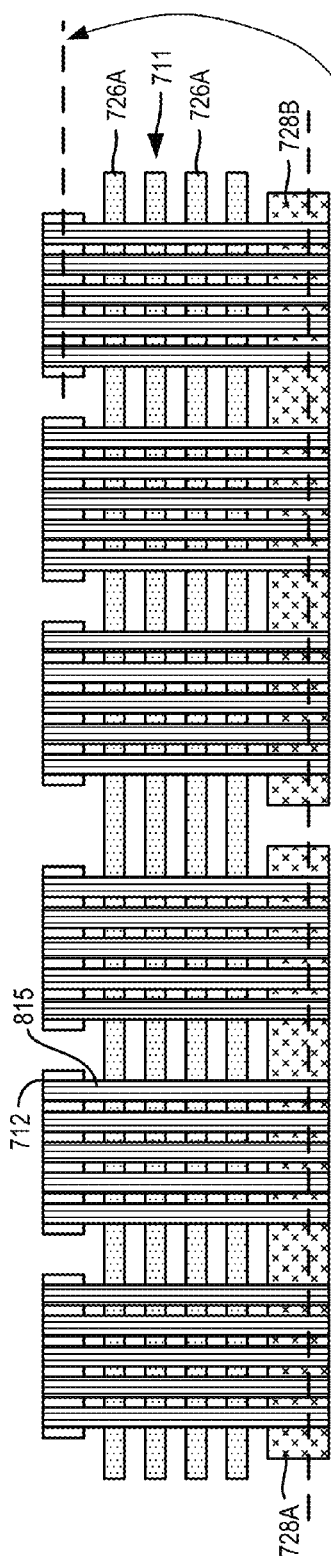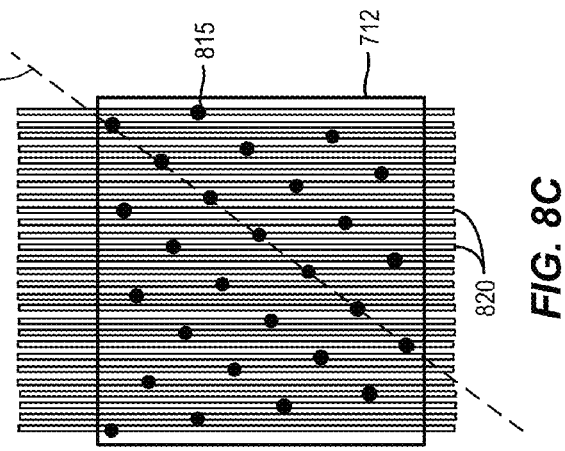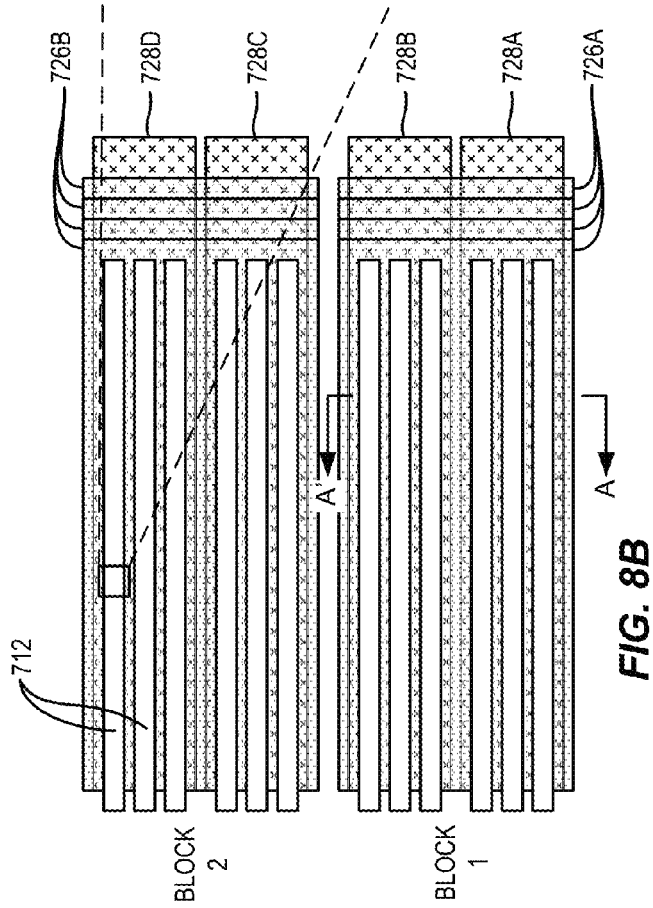
FIG. 8A
FIG. 8B
FIG. 8C

SEPARATED LOWER SELECT LINE IN 3D NAND ARCHITECTURE

CROSS-REFERENCE TO OTHER APPLICATIONS

This application makes reference to the following U.S. patent applications, all incorporated by reference herein:

U.S. application Ser. No. 14/157,550, filed 17 Jan. 2014, entitled THREE-DIMENSIONAL SEMICONDUCTOR DEVICE;

U.S. application Ser. No. 14/582,848, filed 24 Dec. 2014, entitled PARALLELOGRAM CELL DESIGN FOR HIGH SPEED VERTICAL CHANNEL 3D NAND MEMORY, by inventor Shih-Hung Chen;

U.S. application Ser. No. 14/582,963, filed 24 Dec. 2014, entitled TWISTED ARRAY DESIGN FOR HIGH SPEED VERTICAL CHANNEL 3D NAND MEMORY, by inventor Shih-Hung Chen.

U.S. application Ser. No. 14/637,187, filed 3 Mar. 2015, entitled VERTICAL THIN-CHANNEL MEMORY, by inventor Hang-Ting Lue.

BACKGROUND

Field of the Invention

The present invention relates to high density memory devices, and particularly to memory devices in which multiple planes of memory cells are arranged to provide a three-dimensional 3D array.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30nm Node," IEEE Int'l Electron Devices Meeting, 11-13 Dec. 2006, incorporated by reference herein.

Another structure that provides vertical NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009, incorporated by reference herein. The structure described in Katsumata et al. includes a vertical NAND gate, using silicon-oxide-nitride-oxide-silicon SONOS charge trapping technology to create a storage site at each gate/vertical channel interface. The memory structure is based on a column of semiconductor material arranged as the vertical channel for the NAND gate, with a lower select gate adjacent the substrate, and an upper select gate on top. A plurality of horizontal word lines is formed using planar word line layers that intersect with the columns, forming a so-called gate all around cell at each layer.

FIG. 1 is a horizontal cross-section of a column of a pipe-shaped BiCS flash cells, such as described in the Katsumata et al. publication, at the level of a word line. The structure includes a pillar 15 having a center core 110 of semiconductor material which extends vertically through a stack of word line layers. The core 110 may have a seam 111 through the middle that arises from the deposition technique. A dielectric charge trapping structure comprising for example a first layer 112 of silicon oxide, a layer 113 of silicon nitride and a second layer 114 of silicon oxide (referred to as ONO), or another multilayer dielectric charge trapping structure surrounds the core 110. A gate all-around word line is intersected by the pillar. A frustum of the pillar at each layer combines with the gate all-around word line structure at that layer, to form a memory cell.

FIG. 2 is a perspective view of a 3D semiconductor device. It comprises a multilevel stack of word line conductive layers 11, each parallel to the substrate (not shown); a plurality of pillars 15 oriented orthogonally to the substrate, each of the pillars comprising a plurality of series-connected memory cells located at cross-points between the pillars and the conductive layers; and a plurality of string select lines (SSLs) 12 oriented parallel to the substrate and above the conductive layers 11, each of the string select lines intersecting a respective row of the pillars. Each intersection of a pillar and a string select line defines a string select gate (SSG) of the pillar. The structure also includes ground select lines (GSL) 13 (also sometimes called lower select lines especially in embodiments, like FIG. 2, where they are located at the lower end of a pillar) oriented parallel to the substrate and forming a layer below the word line conductive layers 11. Each intersection of a pillar and a ground select line 13 defines a ground select gate (GSG) (also sometimes called a lower select gate (LSG) of the pillar. A common source line (CSL) 10 is formed in a layer parallel to the substrate and below the GSLs. The structure also includes a plurality of parallel bit line conductors 20 in a layer parallel to the substrate and above the string select lines. Each of the bit line conductors superposes a respective column of the pillars, and each of the pillars underlies one of the bit line conductors. The pillars may be constructed as described above with respect to FIG. 1.

The illustration of FIG. 2 shows two blocks of memory cells laterally, due to the lateral split between two portions 26A and 26B of the word line conductive layers 11. For example, word line 26A defines one block of memory cells, whereas word line 26B defines a second block of memory cells. Similarly, the illustration shows two corresponding ground select lines 28A and 28B.

FIG. 3 is a top view of a portion of the structure of FIG. 2. As can be seen, a word line such as 26A intersects only some of the pillars in the overall structure; each word line 26A or 26B defines a block of memory cells. Thus to read data from a particular block of the memory, control circuitry activates a word line 26A, 26B to select a block of cells and a particular layer of the stack, and further activates a string select line 12 to select a particular row. A ground select gate is activated as well. A row of cells is then read out in parallel via the bit line conductors 20 into a page buffer (not shown). ("Activate", as used herein, means to apply a particular bias so as to give effect to the connected cells or switches. The bias may be high or low, depending on the memory design.) Depending on the product specification and design, the page buffer may hold two or more rows of data, in which case a full page read operation would involve successive activation of two or more SSLs 12.

While 3D stacking memory structures hold the promise of greatly increased memory density, they also introduce significant process challenges because, among other things, of the need to etch very deep holes through many layers. Such deep holes have to be made wider, and have to be placed at greater center-to-center distance from each other laterally, in order to meet process windows. As fabrication processes improve, capacity may be increased not only by increasing the number of word line planes in the stack, but also by reducing the spacing between the pillars. FIG. 4 is a top view of a scaled down structure in which both the number of bit lines 20 in a block and the number of SSLs 12 in the block have been increased. Not only does the cost decrease, but increased read/write data rate can be achieved as well because the larger number of bit lines 20 means increased parallel operation. On the other hand, the increased number of SSLs 12 means more cells will suffer Vpass disturb due to word line select. Unit cell capacitance also increases with the number of SSLs 12, thereby increasing power consumption and slowing device operation.

Increasing bit density by increasing the number of word line conductive layers 11 in the stack also has downsides, even aside from the expected process challenges of increased numbers of layers. In FIG. 2 it can be seen that a typical arrangement has a stepped contact structure to the word line conductive layers 11. Deep etches are made through the structure in order to form contacts 22 to connect the conductive layers 11 to metal interconnects 24 above. These contacts 22 are also shown symbolically in the top view of FIG. 4. In a typical design, the number of rows of pillars 15 in a block is at least as great as the number of contacts 22, and hence memory layers. See, for example, Komori, Y., et al., "Disturbless flash memory due to high boost efficiency on BiCS structure and optimal memory film stack for ultra high density storage device," Electron Devices Meeting, 2008, IEDM 2008, IEEE International, vol., no., pp. 1-4, 15-17 (December 2008) at 2, incorporated herein by reference. Thus increasing the number of memory layers also increases the number of SSLs 12, and again increases power consumption and slows device operation.

In the conventional arrangement of FIG. 2, the ground select lines 13 have approximately the same width in the bit line direction as the word line conductive layers 11. That is, there is one GSL per block. As a result, when the lower select gate is activated in order to activate a row of memory cells, that same action also activates the lower select gates of all the other memory cells of the block. Thus unselected pillars sharing the activated lower select line are connected to the source, further exacerbating the problem of Vpass disturb.

The above-incorporated Komori paper addresses this problem by changing the ground select lines 13 (which are more like plates in FIG. 2) to a line and space pattern in the same way as the string select lines 12 so that the string select lines and the ground select lines can be turned on and off synchronously. In Komori's concept, the GSLs 13 have roughly the same lateral pattern and position as the SSLs 12, several layers above. This structure allows the control circuitry to activate both the upper and lower select lines of only the pillars in the desired row of memory cells, without having to also activate the lower select gates of any other memory cells in the block. However, Komori's structure decreases bit density in the bit line direction substantially, because not only do the design rules need to allocate a margin for potential misalignment of the SSLs relative to a row of pillars, but they also need to allocate an additional margin for the GSLs, which could misalign relative to the row of pillars in the opposite direction.

In Katsumata, incorporated above, another structure is proposed to address the problem of Vpass disturb. In Katsumata, a pipe-shaped Bit Cost Scalable (P-BiCS) flash memory is proposed which consists of pipe-shaped NAND strings folded like a U-shape instead of the straight-shape. Two adjacent pillars are connected together horizontally at the bottoms by a so-called pipe-connection. Thus both ends of the NAND string are located at or near the top of the structure rather than the bottom. In particular, both the SSLs and the GSLs are located at the top of the structure, removing the need for a design rule margin to cover potential misalignment of line-space GSL at the bottom of the structure. Some of the density improvement is lost, however, because of the need to form a deep slit between the two pillars of a NAND string in order to be able to separately control the two memory cells of a string which both intersect the same word line conductive layer.

An opportunity therefore arises to create robust solutions to the problem of increasing bit density of 3D memory structures while reducing the negative impacts that such increases tend to cause. Better chip yields, and denser, and more powerful circuits, components and systems may result.

SUMMARY

Roughly described, the present technology provides a memory device having a multilevel stack of conductive layers oriented parallel to a substrate, each of the conductive layers being divided into a plurality of word lines. A plurality of pillars are oriented orthogonally to the substrate, each of the pillars comprising a plurality of series-connected memory cells located at cross-points between the pillars and the word lines. A plurality of string select lines are oriented parallel to the substrate and above the conductive layers, each of the string select lines intersecting a respective distinct subset of the pillars, each of the intersections of a pillar and a string select line defining a respective string select gate of the pillar. A plurality of parallel bit line conductors are disposed in a layer parallel to the substrate and above the string select lines, each of the bit line conductors superposing a respective distinct subset of the pillars, each of the pillars underlying one of the bit line conductors. Below each of the word line conductors is a plurality of ground select lines oriented parallel to the substrate and below the conductive layers, each of the ground select lines intersecting a respective distinct subset of the pillars, each of the intersections of a pillar and a ground select line defining a respective ground select gate of the pillar. The number of ground select lines underlying each of the word select lines is greater than 1 but less than the number of string select lines overlying the word select line. The technology permits a designer to trade off density in the bit line direction in favor of reduced Vpass disturb, by varying the number of separate ground select lines per block in different embodiments.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which:

FIGS. 5A and 5B (collectively FIG. 5) are two views of the 3D memory structure of FIG. 2.

FIGS. 6A and 6B (collectively FIG. 6) are two views of a 3D memory structure incorporating features of the invention.

FIGS. 7A, 7B and 7C (collectively FIG. 7) are two views of another 3D memory structure incorporating features of the invention.

FIGS. 8A, 8B and 8C (collectively FIG. 8) are two views of another 3D memory structure incorporating features of the invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
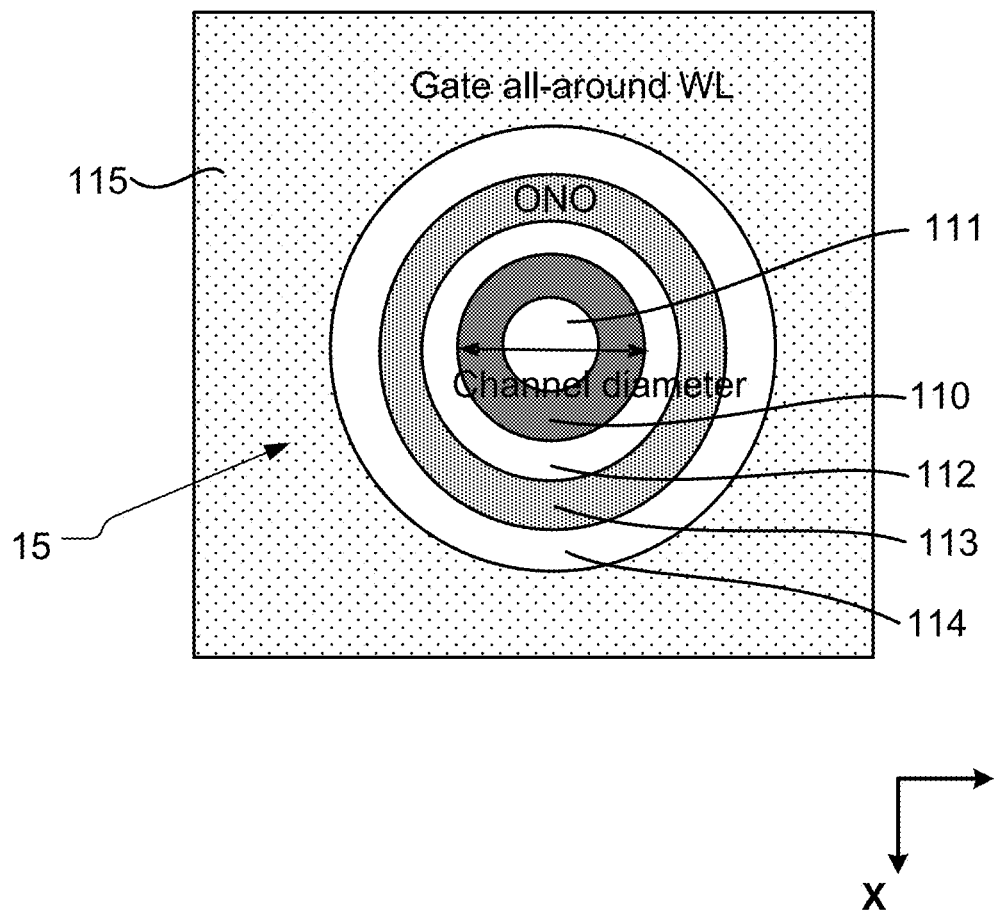
FIG. 1 illustrates a horizontal cross-section of a column of a pipe-shaped BiCS flash cell.
Figure 2:
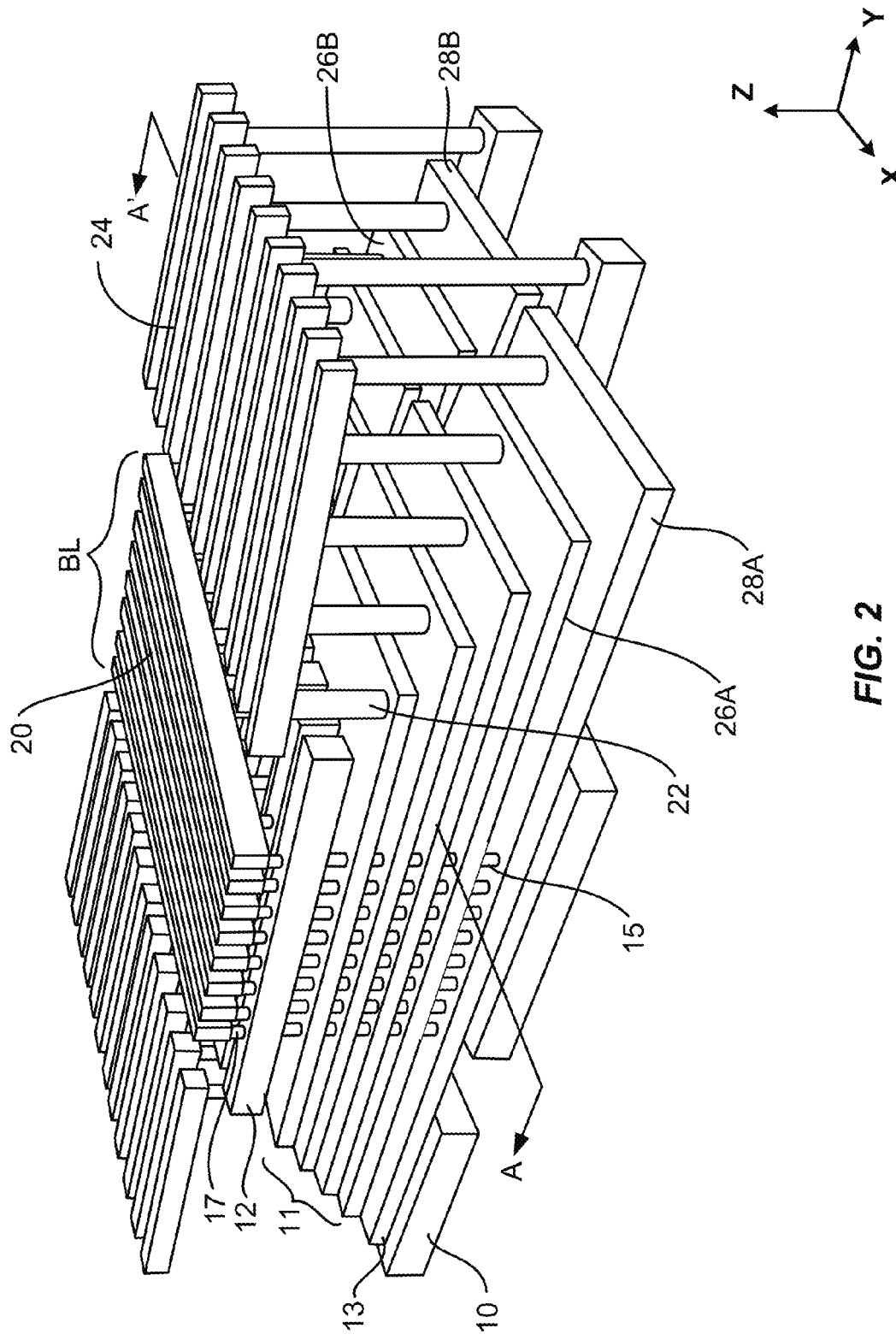
FIG. 2 is a perspective view of a 3D semiconductor device.
Figure 3:
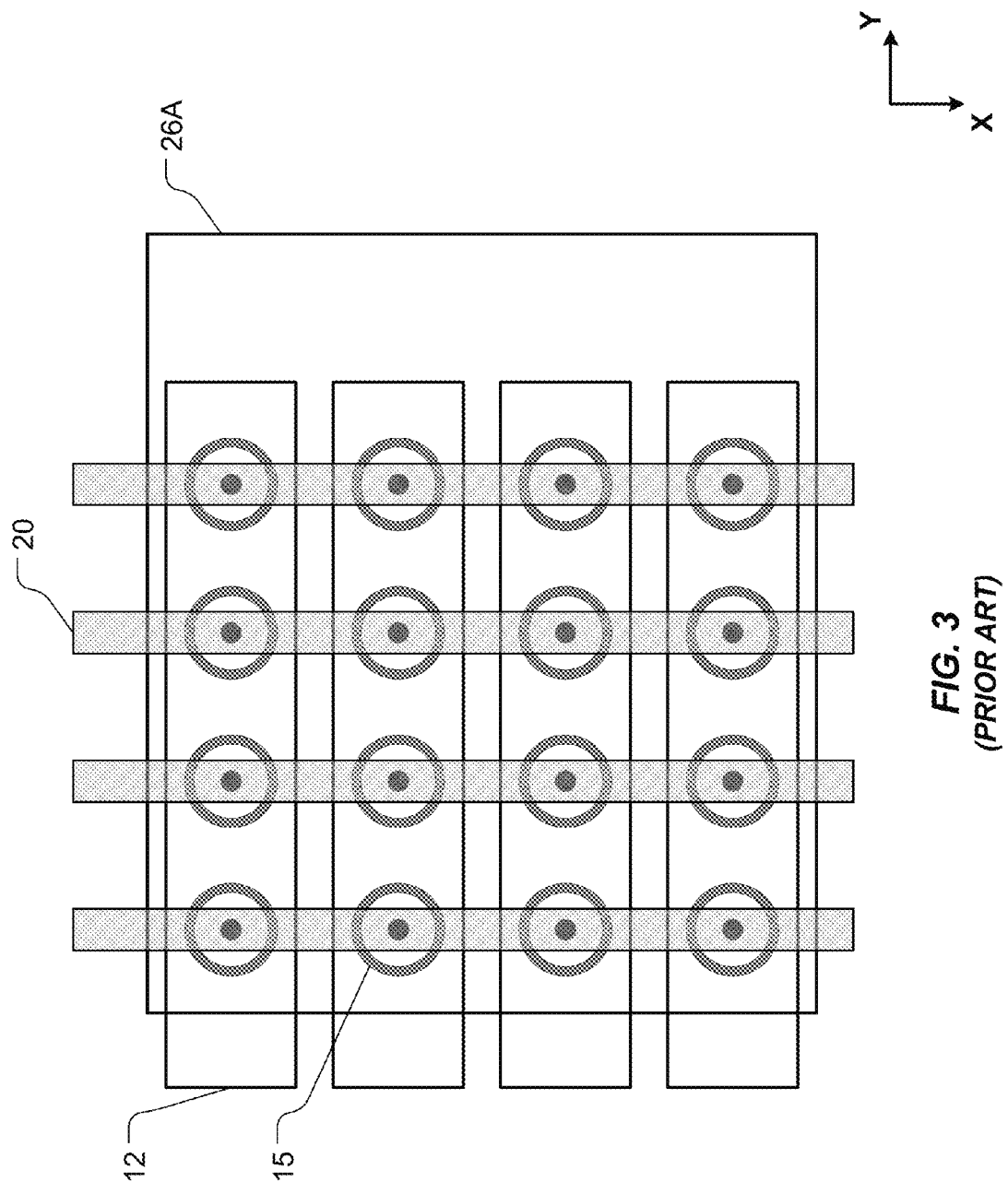
FIG. 3 is a top view of a portion of the structure of FIG. 2.
Figure 4:
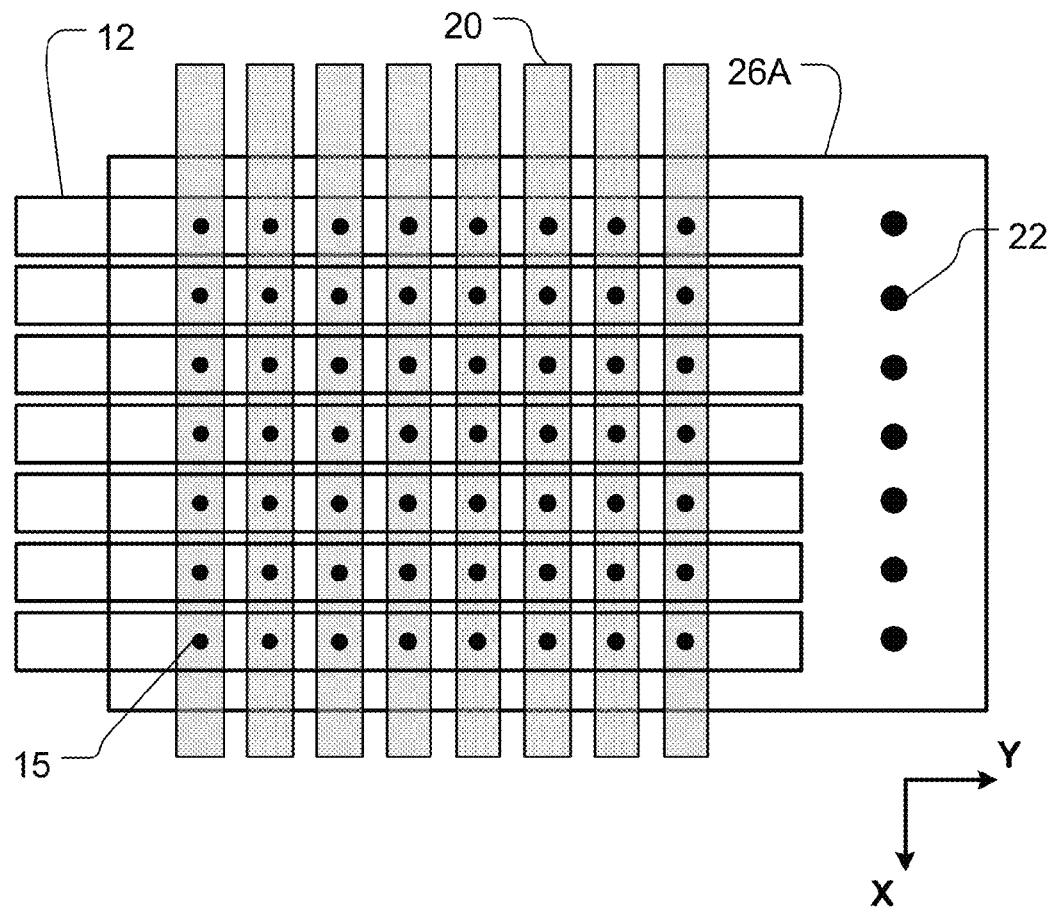
FIG. 4 is a top view of a portion of the structure of FIG. 2, scaled down to permit more bit lines and SSLs.

FIGS. 5A and 5B (collectively FIG. 5) are two views of the conventional 3D memory structure in FIG. 2. FIG. 5A is a schematic cross-sectional view, taken from sight lines A-A', of FIG. 2, and FIG. 5B is a top view of the left half of structure as shown in FIG. 5A. Sight lines A-A' are shown in FIG. 5B as well. As can be seen, the structure includes a number of pillars 515, which may be as shown in FIG. 1. The structure also includes a number of string select lines 512 (16 are shown in FIG. 5A, and 8 of them appear in FIG. 5B). Also shown are four word line conductive layers 511, formed parallel to the substrate (not shown) and below the string select lines 512. The word line conductive layers 511 are split laterally so that each layer contains two separate word lines 526A and 526B (collectively 526) spaced from each other in the bit-line direction. The word lines 526A and 526B are "separate" in the sense that their connection to control circuitry allows them to be driven to different levels; they are not connected together permanently. Each intersection of a word line 526 and a pillar 515 defines a memory cell, and because they are series connected along a pillar 515, the pillar defines a "string" of memory cells. The bit line conductors are not shown in FIGS. 5A and 5B, but they are formed in a layer parallel to the substrate and above the string select lines 512, and oriented in a direction generally perpendicular to the string select lines 512. Each of the bit line conductors superposes a respective one of the pillars 515, and each of the pillars 515 underlies one of the bit line conductors. Arrows 502 indicate the bit line direction. Also shown in FIG. 5A are the ground select lines 528A and 528B (collectively 528), underlying the word lines 526A and 526B, respectively. Pillars 515 are also shown in FIG. 5A, one in the bit line direction per string select line 512. Word lines 526A and ground select lines 528A are shown in FIG. 5B, but word lines 526B and ground select lines 528B are not. FIG. 5B also shows the stepped contact structure of the word lines 526A and ground select line 528A. The pillars 515 are also omitted from FIG. 5B for clarity of illustration.

As used herein, As used herein, "lateral" dimensions refer to dimensions of the structure which are parallel to the substrate. For example, the dimensions labeled X and Y in FIG. 2 are considered "lateral" dimensions herein, whereas the dimension labeled Z is sometimes referred to as a "vertical" dimension. In addition, layers which are termed "above" or "below" other layers, can in various embodiments be separated from such other layers by one or more intervening layers. If no intervening layer is intended, then the terms "immediately above" or "immediately below" are used herein. The same interpretation is intended for layers described as "superposing", "underlying" or "over" another layer.

In operation, a string of memory cells is selected by activating both the string select gate and the ground select gate of the pillar 515, thereby connecting one end of the string to a bit line (not shown) and the opposite end to a common source line CSL (not shown) The string select gate is activated by providing an appropriate signal on the string select line 512 that intersects the pillar 515, and the ground select gate is activated by providing an appropriate signal on the ground select line 528. Despite the names "ground" select gate and "ground" select line, it will be appreciated that the common source line may at to potentials other than ground in various embodiments.

As can be seen in FIG. 5, in order to satisfy process windows, a spacing is needed in the bit line direction between each pair of string select lines. Spacing is needed in the bit line direction also between each lateral pair of ground select lines 528, and a margin is also needed between the edge of a string select line 512 and the edge of the word lines 526. Both of these considerations increase the required spacing between the two string select lines 512 straddling the split between the word lines 526. Thus it can be seen that the pitch $P_{SSL}$ in the bit line direction at which the string select lines 512 are spaced is smaller (by a factor of more than 8 in FIG. 5) than the pitch $P_{GSL}$ in the bit line direction at which the ground select line lines 528 are spaced. And the pitch $P_{WL}$ in the bit line direction at which the word lines 526 are spaced is the same as the pitch $P_{GSL}$ in the bit line direction at which the ground select line lines 528 are spaced. Note that the pitch $P_{SSL}$ is constant over the width (in the bit line direction) of one ground select line 528, but over the width of more than one ground select line the pitch varies. For purposes of the present discussion, the pitch $P_{SSL}$ over a given width is considered to be the minimum pitch over that width. The same convention is used herein for pitches $P_{GSL}$ and $P_{WL}$.

In addition, in some embodiments two or more word lines are laterally interdigitated. See, for example, U.S. patent application Ser. No. 14/460,328, filed 14 Aug. 2014, entitled 3D INDEPENDENT DOUBLE GATE FLASH MEMORY ON BOUNDED CONDUCTOR LAYER, by inventor Hang-Ting Lue, incorporated by reference herein. That application describes an arrangement in which conductive layers are split laterally into separate even and odd word lines which are interdigitated with each other in the bit line direction. In such an arrangement the "width" of each word line (even or odd) is considered herein to be the distance in the bit line direction across the entire word line, including portions of that distance which are occupied by digits of other word lines. The "pitch" $P_{WL}$ of each word line (even or odd) in such an embodiment is considered herein to be the width of the word line plus the spacing in the bit line direction to the near edge of the next occurrence of the same type of word line (even or odd). The same convention is used herein for the pitches $P_{SSL}$ and $P_{GSL}$.

In another way of viewing the structure of FIG. 5, it can be seen that the number $N_{SSL}$ of string select lines 512 overlying a ground select line 528 is greater than one (8 in FIG. 5), and the number $N_{GSL}$ of ground select lines 528 underlying a word line (the number of GSLs per block) is exactly one.

In yet another way of viewing the structure of FIG. 5, and considering that a typical memory array includes many more than two blocks in the bit line direction, it can be seen that the total number $N_{GSL}$ of ground select lines 528 covering the array width is the same as the number of word lines $N_{WL}$ covering the array width, but different from (and smaller than by a factor of 8 in FIG. 5) the number of string select lines $N_{SSL}$ covering the array width.

As mentioned, the arrangement of FIGS. 2 and 5 suffers from Vpass disturb because eight ground select gates (in the illustration of FIG. 5) share a single common ground select line 528. Thus when activating the ground select gates for one row of pillars 515, the ground select gates for the other seven rows of pillars sharing the same ground select line 528 will be detrimentally activated as well to connect those pillars to the source line.

FIGS. 6A and 6B (collectively FIG. 6) are two views of a 3D memory structure incorporating features of the invention. FIG. 6A is a schematic cross-sectional view and FIG. 6B is a top view of the same structure. Sight lines A-A' are shown in FIG. 6B to illustrate the view taken in FIG. 6A. As can be seen, the structure includes a number of pillars 615, which may be as shown in FIG. 1. Alternatively they may have other cross-sectional features. As another example they may be as described in the above-incorporated U.S. application Ser. No. 14/637,187. The structure also includes 12 string select lines 612. Also shown are four word line conductive layers 611, formed parallel to the substrate (not shown) and below the string select lines 612. As in the structure of FIG. 5, the word line conductive layers 611 are divided laterally so that each layer contains two separate word lines 626A and 626B (collectively 626) spaced from each other in the bit-line direction. Arrows 602 indicate the bit line direction. Pillars 615 are also shown in FIG. 6A, one in the bit line direction per string select line 612. The pillars 615 are omitted from FIG. 6B for clarity of illustration.

Also shown in FIG. 6A are four ground select lines 628A, 628B, 628C and 628D (collectively 628): GSLs 628A and 628B, underlie the word line 626A and GSLs 628C and 628D, underlie the word line 526B. Thus compared to FIG. 5, each GSL 628 has been divided into two. This decreases the average density of pillars somewhat in the bit line direction, but advantageously, far fewer memory cells are subject to Vpass disturb when one of the GSLs 628 is activated. It will be appreciated that in various embodiments, the ground select lines can be split into any number of segments per block, so long as each ground select line underlies an integer number of string select lines 612. The narrower the GSLs, the lower the average density of pillars in the bit line direction, but the lower the number of pillars subjected to Vpass disturb. Thus by varying the number of separate GSLs 628 per block in different embodiments, a designer can select a desired point in a tradeoff between reduced Vpass disturb at the expense of reduced density in the bit line direction. It will also be appreciated that in some embodiments different ground select lines 628 can have different widths in the bit line direction, so long as at least one of the GSLs underlies at least two of the string select lines 612.

As explained above with respect to FIG. 5, in order to satisfy process windows, a spacing is needed in the bit line direction between each pair of string select lines 612, between each pair of ground select lines 628, and between each pair of word lines 626. A margin is also needed on both sides of a ground select line split, and on both sides of a word line split. Thus it can be seen that, like the structure of FIG. 5, the minimum pitch $P_{SSL}$ in the bit line direction at which the string select lines 612 are spaced is smaller (by a factor of more than 3 in FIG. 6) than the pitch $P_{GSL}$ in the bit line direction at which the ground select line lines 528 are spaced. But unlike FIG. 5, the pitch $P_{GSL}$ in the bit line direction at which the ground select lines 628 are spaced is smaller (by a factor of more than 2 in FIG. 6) than the pitch $P_{WL}$ in the bit line direction at which the word lines 626 are spaced. In various embodiments, over any width of ground select lines 628 which are adjacent to each other in the bit line direction, the minimum pitch $P_{GSL}$ of the ground select lines 628 is greater than the minimum pitch $P_{SSL}$ of the string select lines 612, but less than the minimum pitch $P_{WL}$ of the word lines 626. Preferably $P_{WL} \geq 2*P_{GSL}$, and more preferably $P_{WL} > 2*P_{GSL}$. Also preferably $P_{GSL} \geq 2*P_{SSL}$, and more preferably $P_{GSL} > 2* P_{SSL}$.

As used herein, two items are "adjacent" to each other if they are not separated by another item of the same type. For example, two lines are considered "adjacent" to each other if there is no intervening line between them, even if the two lines do not touch each other. Immediate adjacency is not required by the term "adjacent" unless called for explicitly.

In another way of viewing the structure of FIG. 6, it can be seen that the number $N_{SSL}$ of string select lines 612 overlying a ground select line 628 is greater than one (it is 3 in FIG. 6), and preferably it is between 1 and 9, exclusive. Unlike the structure of FIG. 5, the structure of FIG. 6 has more than one ground select line 628 underlying a word line. In particular, the number $N_{GSL}$ of GSLs per block is two in FIG. 6. In various embodiments, for each i'th one of the word lines 626, the number $N_{GSLi}$ of ground select lines underlying the i'th word line is between 1 and the number $N_{SSLi}$ of string select lines superposing the i'th word line, exclusive. Preferably the number $N_{GSLi}$ of ground select lines 628 underlying each i'th word line 626 is the same for all word lines i, and the number $N_{SSLi}$ of string select lines 612 superposing each i'th word line is the same for all word lines i. Neither condition is essential in all embodiments, though additional steps may be needed for successful operation of an embodiment in which either $N_{GSLi}$ or $N_{SSLi}$ or both are not the same for all word lines i.

In yet another way of viewing the structure of FIG. 6, and considering that a typical memory array includes many more than two blocks in the bit line direction, it can be seen that the total the number $N_{GSL}$ of the ground select lines covering the array width is different from both the number of string select lines $N_{SSL}$ covering the array width and the number of word lines $N_{WL}$ covering the array width. Preferably $N_{SSL} > N_{GSL}$, and preferably $N_{GSL} > N_{WL}$.

Multiple Pillars per SSL

In the embodiment of FIG. 6, the rows of pillars 615 are perpendicular to the bit line direction, and each string select line 612 intersects a single row of pillars. In fact density can be increased by using arrangements of pillars and string select lines by which each string select line intersects multiple rows of pillars. The above-incorporated U.S. patent application Ser. No. 14/582,848, filed 24 Dec. 2014, entitled PARALLELOGRAM CELL DESIGN FOR HIGH SPEED VERTICAL CHANNEL 3D NAND MEMORY, by inventor Shih-Hung Chen, describes one class of pillar arrangements in which, roughly described, pillars are arranged on a regular grid having a unit cell which is a non-rectangular parallelogram. The pillars may be arranged so as to define a number of parallel pillar lines, the pillar lines having an acute angle θ>0° of intersection with the bit line conductors, each line of pillars having more than one pillar all intersecting just one of the string select lines.

Similarly, the above-incorporated U.S. patent application Ser. No. 14/582,963, filed 24 Dec. 2014, entitled TWISTED ARRAY DESIGN FOR HIGH SPEED VERTICAL CHANNEL 3D NAND MEMORY, by inventor Shih-Hung Chen, describes another class of pillar arrangements in which, roughly described, pillars are arranged on a regular grid which is rotated relative to the bit line conductors. The grid may have a square, rectangle or diamond-shaped unit cell, and may be rotated relative to the bit lines by an angle θ where $\tan(\theta) = \pm X/Y$, where X and Y are co-prime integers. The SSLs may be made wide enough so as to intersect two pillars on one side of the unit cell, or all pillars of the cell, or sufficiently wide as to intersect pillars in two or more non-adjacent cells.

Both the parallelogram arrangements and the twisted array arrangements of pillars permit a higher density of bit lines, thereby enabling a higher data rate due to increased parallel operation. They also enable a smaller number of SSLs, thereby reducing disturbance, reducing power consumption and further improving data rate by reducing unit cell capacitance.

FIGS. 7A, 7B and 7C (collectively FIG. 7) illustrate modifications of the structure of FIG. 6 in which the SSLs are widened in the bit line direction, and a parallelogram array of pillars per SSL is substituted for the single pillar per SSL in FIG. 6. FIG. 7A is a schematic cross-sectional view and FIG. 7B is a top view of the same structure. Sight lines A-A' are shown in FIG. 7B to illustrate the view taken in FIG. 7A. For clarity of illustration, only one of the blocks (Block 1) in FIG. 7B is visible in FIG. 7A. As can be seen, the structure includes 12 string select lines 712, only six of which are visible in FIG. 7A. Also shown are the four word line conductive layers 711, formed parallel to the substrate (not shown) and below the string select lines 712. As in the structure of FIGS. 5 and 6, the word line conductive layers 711 are split laterally so that each layer contains two separate word lines 726A and 726B (collectively 726) spaced from each other in the bit-line direction. Only the block corresponding to word line 726A is shown in FIG. 7A. FIG. 7C illustrates a top view of a region of one of the SSLs 712 showing an example parallelogram arrangement of pillars 715 having five adjacent rows of pillars, each shifted in a direction orthogonal to the bit lines by a distance d/5 relative to the immediately adjacent row of pillars, where d is the minimum pitch of the pillars. As a result, five times as many bit lines 720 can be accommodated, thereby greatly increasing parallel operation. The bit line pitch has been reduced to d/5, and a single merged SSL 712 reduces the number of SSLs in the grid by 4/5, thereby reducing disturbance, reducing power consumption and further improving data rate by reducing unit cell capacitance. Finally, with the merged SSL, the design rule requirements for inter-SSL spacings and severity of the gate thicknesses design rule in the bit line direction are reduced across the grid of pillars.

Similarly, FIGS. 8A, 8B and 8C (collectively FIG. 8) illustrate modifications of the structure of FIG. 6 in which the SSLs are widened in the bit line direction, and a twisted array of pillars per SSL is substituted for the single pillar per SSL in FIG. 6. FIGS. 8A and 8B are the same as FIGS. 7A and 7B, and their description is not repeated here. FIG. 8C illustrates a top view of a region of one of the SSLs 712 showing an example twisted array arrangement of pillars 815 in which a square grid of pillars is rotated by an angle θ=arctan(3/4) which is approximately 36.9°. The distance between pillars in the lateral dimension orthogonal to the bit lines in this grid can be calculated geometrically and is equal to 0.2 d, where d is the minimum pitch of the pillars. Thus the bit lines can be spaced with a pitch of $P_P$=0.2 d, resulting in a five-fold increase in the number of data bits that can be read out in parallel. In addition, a single SSL 712 overlies multiple rows of the pillars 815. The use of a single SSL 712 is possible because due to the rotation angle, multiple pillars that previously would have been aligned along a single bit line conductor are now served by different bit line conductors. As a result, the intersection of one SSL 712 and one bit line conductor 820 still uniquely identifies a single one of the pillars 815. Using the grid of FIG. 8C, bandwidth increases by a factor of 5, and power consumption and stress each decrease by a factor of 5. In addition, the significant reduction in the number of separate SSLs needed per block also means far fewer decoders are needed, resulting in lower cost.

As explained above with respect to FIG. 6, in the split GSL topology of FIGS. 7 and 8, the minimum pitch $P_{SSL}$ in the bit line direction at which the string select lines 712 are spaced is smaller than the pitch $P_{GSL}$ in the bit line direction at which the ground select line lines 728 are spaced. But unlike FIG. 5, the pitch $P_{GSL}$ in the bit line direction at which the ground select lines 728 are spaced also is smaller than the pitch $P_{WL}$ in the bit line direction at which the word lines 726 are spaced. In addition, in FIGS. 7 and 8, the pitch $P_P$ at which the pillars are spaced in the bit line direction is smaller than the pitch $P_{SSL}$ at which the string select lines 712 are spaced. Thus in various embodiments, over any width of ground select lines 728 which are adjacent to each other in the bit line direction, not only is the minimum pitch $P_{GSL}$ of the ground select lines 728 greater than the minimum pitch $P_{SSL}$ of the string select lines 712, and less than the minimum pitch $P_{WL}$ of the word lines 726, but the minimum pitch $P_P$ at which the pillars are spaced in the bit line direction is also smaller than the pitch $P_{SSL}$ at which the string select lines 712 are spaced.

In another way of viewing the structures of FIGS. 7 and 8, again as explained above with respect to FIG. 6, in the split GSL topology of FIGS. 7 and 8, the number $N_{SSL}$ of string select lines 712 overlying a ground select line 728 is greater than one, and the number $N_{GSL}$ of ground select lines 728 underlying a word line 726 also greater than one. In addition, in FIGS. 7 and 8, the number of pillars in the bit line direction underlying each SSL is also greater than one.

In yet another way of viewing the structures of FIGS. 7 and 8, again as explained above with respect to FIG. 6, in the split GSL topology of FIGS. 7 and 8, it can be seen that the total the number $N_{GSL}$ of the ground select lines covering the array width is different from both the number of string select lines $N_{SSL}$ covering the array width and the number of word lines $N_{WL}$ covering the array width. In addition, in FIGS. 7 and 8, the number of rows of pillars $N_P$ in the bit line direction is also greater than the number $N_{SSL}$ of SSLs 712 in the bit line direction.

Figure 9:
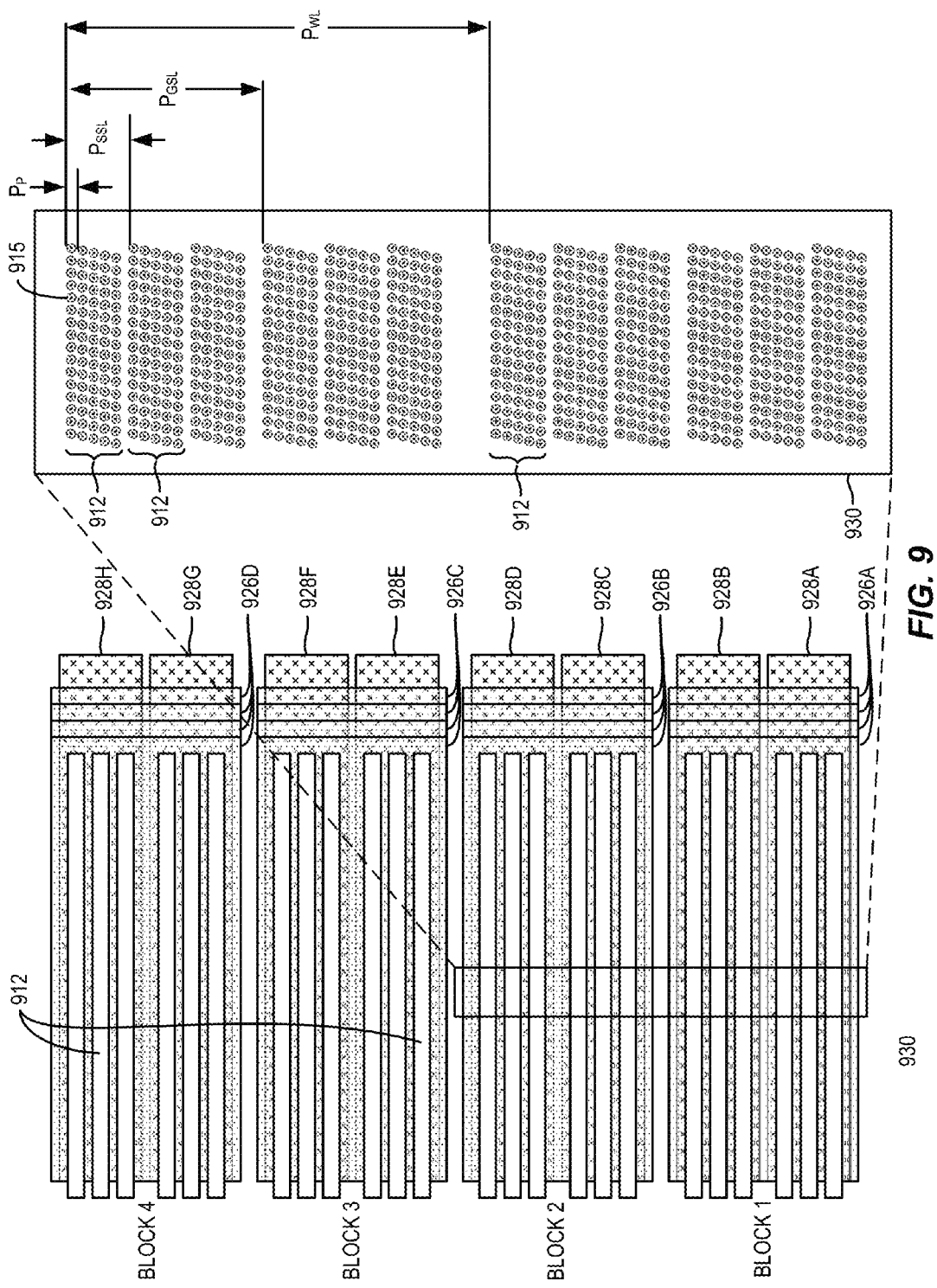
FIG. 9 is another view of a portion of the structure of FIG. 7.

FIG. 9 illustrates the multiple periodicity patterns that embodiments of the invention can exhibit inside the memory array. The illustration of FIG. 9 uses the parallelogram arrangement of FIG. 7C to increase the density of bit lines and reduce the density of SSLs 912, but the twisted array arrangement of FIG. 8C could be used instead. The left side of FIG. 9 is a top view of a portion of a memory array. Four blocks of cells are shown: block 1 is defined by word lines 926A, block 2 is defined by word lines 926B, block 3 is defined by word lines 926C, and block 4 is defined by word lines 926D (collectively 926). Each block contains two ground select lines underlying the word lines and spaced from each other in the bit line direction. Specifically block 1 contains GSLs 928A and 928B, block 2 contains GSLs 928C and 928D, block 3 contains GSLs 928E and 928F, and block 4 contains GSLs 928G and 928H (collectively 928). Each GSL 928 underlies three SSLs 912. On the right hand side of FIG. 9 is an enlargement of a region 930, showing only a strip in the bit line direction of blocks 1 and 2. The individual pillars 915, in parallelogram arrangement, are visible in the enlargement. Also the pitches in the bit line direction are designated: $P_P$ is the minimum pitch of the pillars 915; $P_{SSL}$ is the minimum pitch of the SSLs 912; $P_{GSL}$ is the minimum pitch of the GSLs 928, and $P_{WL}$ is the minimum pitch of the word lines 926. Thus across the array in the bit line direction, the pillars 915 repeat with the smallest period $P_P$; the SSLs 912 repeat with the next smallest period $P_{SSL}$; the GSLs 928 repeat with the next smallest period $P_{GSL}$, and the word lines 926 repeat with the largest period $P_{WL}$. Preferably the word lines 926 do not repeat more than 4096 times.

Figure 10:
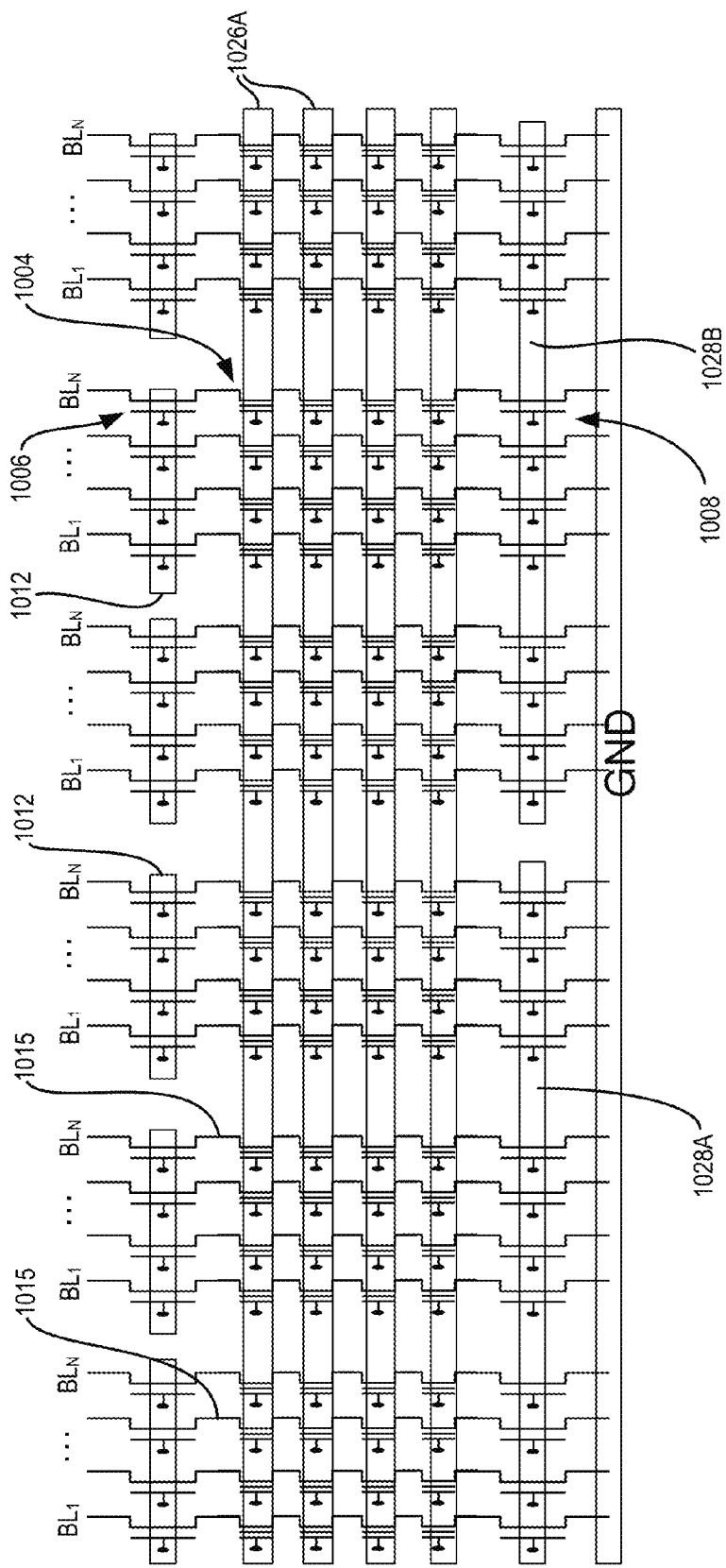
FIG. 10 illustrates an electrical view of a block of memory incorporating aspects of the invention.

FIG. 10 illustrates an electrical view of a block of memory incorporating aspects of the invention. As shown, the memory includes a number $N_P$ (24 in FIG. 10) of strings 1015 of series-connected memory cells 1004. Each string 1015 has a number $N_C$ (4 in FIG. 10) of memory cells 1004. Each of the memory cells 1004 is structured as shown in FIG. 1, and electrically includes a source, a drain and a control gate. Because of the electrical interchangeability of source and drain in many transistors, these two terminals are sometimes referred to herein collectively as "current path terminals".

Each of the strings 1015 also includes a string select gate 1006 and a ground select gate 1008 series connected on opposite sides of the memory cells 1004 of the string. More particularly, each string select gate 1006 and a ground select gate 1008 includes a control gate electrode and two current path terminals, and the current path terminals are connected in series with the current path terminals of the memory cells 1004 of the string.

The memory also includes $N_C$ (4 in FIG. 10) separate word line conductors 1026A, one corresponding to each of the memory cells 1004 in a string 1015. Each of the word line conductors 1026A is connected to the control gate electrode of the corresponding memory cell 1004 in all of the strings 1015 in the block.

The string select gates 1006 in the memory are divided into a number $N_{SSL}>1$ (six in FIG. 10) distinct subsets of string select gates 1006. The subsets are all "non-null", meaning each of them includes at least one string select gate 1006. In FIG. 10 each of these subsets contains four of the string select gates 1006. The memory also includes $N_{SSL}$ separate string select line conductors 1012, each connected to the control gate electrodes of all the string select gates 1006 in a corresponding one of the subsets of the string select gates.

The ground select gates 1008 in the memory are divided into a different number $N_{GSL}>1$ (two in FIG. 10) of distinct non-null subsets of ground select gates 1008. In FIG. 10 each of the subsets of ground select gates 1008 contains the ground select gates of 12 of the strings 1015. The memory also includes $N_{GSL}$ separate ground select line conductors 1028A, each connected to the control gate electrode of all the ground select gates in a corresponding one of the subsets of ground select gates 1008.

In FIG. 10, and in general, the number $N_{GSL}$ of ground select line conductors in the block is greater than one. Also, the number $N_{SSL}$ of string select line conductors in the block is different than (and preferably greater than) the number $N_{GSL}$ of ground select line conductors in the block. Preferably, however, $N_{SSL}$ is no more than 8 times $N_{GSL}$.

Note that FIG. 10 represents the electrical schematic for the structures of all of FIGS. 6, 7 and 8. In FIG. 6, each SSL 612 intersects only one pillar 615 in the bit line direction, but multiple pillars in a direction perpendicular to the bit line direction (i.e. normal to the page in FIG. 6A). In FIG. 10, this arrangement is satisfied because each of the memory strings 1015 in one SSL 1012 subset is connected (at its top in the drawing) to different bit lines. The same sequence of bit line connections repeats across all the SSL 1012 subsets. That is, if the four bit lines to which the tops of the four memory strings 1015 in one SSL subset are numbered BL1, BL2, BL3 and BL4, then those same four bit lines BL1, BL2, BL3 and BL4 are also connected to the tops of corresponding ones of the memory strings 1015 in each of the other SSL subsets as well.

Alternatively, in FIGS. 7 and 8, each SSL 712 intersects multiple pillars 715/815 in the bit line direction. However, the pillars are offset from each other in a direction normal to the bit lines in FIGS. 7 and 8, such that above each SSL 712, each bit line intersects only one of the pillars visible in these drawings. That is, the intersection of one SSL 712 and one bit line still uniquely identifies exactly one pillar 715/815. Thus the five pillars shown intersecting one of the SSLs 712 in each of FIGS. 7 and 8 are connected at their top to five different bit lines, and those same five bit lines are repeated for each of the SSLs 712. In FIG. 10, this arrangement is satisfied because, again, each of the memory strings 1015 in one SSL 1012 subset is connected at its top to different bit lines, and the same sequence of bit line connections repeats across all the SSL 1012 subsets.

It will further be appreciated that the electrical schematic of FIG. 10 also represents a hybrid structure, for example where each SSL 712 intersects only two pillars 715/815 in the bit line direction. In that case the memory strings 1015 in each SSL 1012 subset represent two rows of pillars 715/815, each intersecting two pillars 715/815 which are offset from each other in a direction orthogonal to the bit lines. Thus again, all four pillars connect at their tops to different bit lines. This hybrid structure, too, is properly represented in FIG. 10 by the indication that each of the memory strings 1015 in one SSL 1012 subset is connected at its top to different bit lines, and the same sequence of bit line connections repeats across all the SSL 1012 subsets.

Note also that a typical memory device may have multiple memory cell blocks like FIG. 10, each defined by the collection of memory cell 1004 control gate electrodes which are connected to a single word line conductor 1026A. Each block typically has the same ratio of $N_{SSL}$ to $N_{GSL}$, but that is not a requirement in all embodiments.

As used herein, a given value is "responsive" to a predecessor value if the predecessor value influenced the given value. If there is an intervening processing element, step or time period, the given value can still be "responsive" to the predecessor value. If the intervening processing element or step combines more than one value, the signal output of the processing element or step is considered "responsive" to each of the value inputs. If the given value is the same as the predecessor value, this is merely a degenerate case in which the given value is still considered to be "responsive" to the predecessor value. "Dependency" of a given value upon another value is defined similarly.

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, whereas embodiments herein are described using vertical channel charge storage memory cells, pillars with other types of memory cells can make use of aspects of the invention as well, albeit without necessarily achieving all of the benefits described above. In particular, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A memory device on a substrate, comprising:
   a multilevel stack of conductive layers, each of the layers being divided into a plurality of adjacent word lines;
   a plurality of pillars oriented orthogonally to the conductive layers, each of the pillars comprising a plurality of series-connected memory cells located at cross-points between the pillars and the word lines;
   a plurality of adjacent string select lines disposed above the conductive layers, each of the string select lines intersecting a respective distinct subset of the pillars, each of the intersections of a pillar and a string select line defining a respective string select gate of the pillar;
   a plurality of parallel bit line conductors disposed above the string select lines, each of the bit line conductors superposing a respective distinct subset of the pillars, each of the pillars underlying one of the bit line conductors; and
   a plurality of adjacent ground select lines disposed below the conductive layers, each of the ground select lines intersecting a respective distinct subset of the pillars, each of the intersections of a pillar and a ground select line defining a respective ground select gate of the pillar,
   wherein the minimum pitch $P_{GSL}$ in a dimension perpendicular to the string select lines, of the ground select lines in the plurality of adjacent ground select lines, is greater than the minimum pitch $P_{SSL}$ in the dimension perpendicular to the string select lines, of the string select lines in the plurality of adjacent string select lines, but less than the minimum pitch $P_{WL}$ in the dimension perpendicular to the string select lines, of the word lines in the plurality of adjacent word lines.

2. The memory device of claim 1, wherein the minimum pitch $P_{WL}$ of the word lines in the plurality of adjacent word lines is at least twice the minimum pitch $P_{GSL}$ of the ground select lines in the plurality of adjacent ground select lines.

3. The memory device of claim 1, wherein the minimum pitch $P_{GSL}$ of the ground select lines in the plurality of adjacent ground select lines is at least twice the minimum pitch $P_{SSL}$ of the string select lines in the plurality of adjacent string select lines.

4. A memory device on a substrate, comprising:
   a multilevel stack of conductive layers, each of the layers being divided laterally into a set of at least one word line;
   a plurality of pillars oriented orthogonally to the conductive layers, each of the pillars comprising a plurality of series-connected memory cells located at cross-points between the pillars and the conductive layers;
   a plurality of string select lines disposed above the conductive layers, each of the string select lines intersecting a respective distinct subset of the pillars, each of the intersections of a pillar and a string select line defining a respective string select gate of the pillar, a number $N_{SSL}$ of the string select lines superposing a first one of the word lines;
   a plurality of parallel bit line conductors disposed above the string select lines, each of the bit line conductors superposing a respective distinct subset of the pillars, each of the pillars underlying one of the bit line conductors; and
   a plurality of ground select lines disposed below the conductive layers, each of the ground select lines intersecting a respective distinct subset of the pillars, each of the intersections of a pillar and a ground select line defining a respective ground select gate of the pillar, a number $N_{GSL}$ of the ground select lines underlying the first word line,
   wherein the number $N_{GSL}$ of the ground select lines underlying the first word line is between 1 and the number $N_{SSL}$ of the string select lines superposing the first word line, exclusive.

5. The memory device of claim 4, wherein:
the set of at least one word lines includes a plurality of the word lines including the first word line,
wherein each i'th one of the word lines in the plurality of word lines is superposed by a respective number $N_{SSLi}$ of the string select lines, and superposes a respective number $N_{GSLi}$ of the ground select lines, and wherein for each i'th one of the word lines in the plurality of word lines, the number $N_{GSLi}$ of ground select lines underlying the i'th word line is between 1 and the number $N_{SSLi}$ of string select lines superposing the i'th word line, exclusive.

6. The memory device of claim 5, wherein the number $N_{GSLi}$ of ground select lines underlying each of the word lines in the plurality of word lines is the same for all word lines i, and the number $N_{SSLi}$ of string select lines superposing each of the word lines in the plurality of word lines is the same for all word lines i.

7. The memory device of claim 4, wherein the number $N_{SSL}$ of string select lines superposing the first word line is not more than 8 times the number $N_{GSL}$ of ground select lines underlying the first word line.

8. A memory device on a substrate, comprising:
a multilevel stack of conductive layers, each of the layers being divided laterally into a set of at $N_{WL} \geq 1$ word lines spaced from each other in a bit line direction, the set of word lines defining an array width in the bit line direction;
a plurality of pillars oriented orthogonally to the conductive layers, each of the pillars comprising a plurality of series-connected memory cells located at cross-points between the pillars and the conductive layers;
$N_{SSL}$ string select lines disposed above the conductive layers, each of the string select lines intersecting a respective distinct subset of the pillars, each of the intersections of a pillar and a string select line defining a respective string select gate of the pillar, the string select lines being spaced from each other in the bit line direction and collectively covering the array width;
a plurality of parallel bit line conductors disposed above the string select lines and defining the bit line direction, each of the bit line conductors superposing a respective distinct subset of the pillars, each of the pillars underlying one of the bit line conductors; and
$N_{GSL}$ ground select lines disposed below the conductive layers, each of the ground select lines intersecting a respective distinct subset of the pillars, each of the intersections of a pillar and a ground select line defining a respective ground select gate of the pillar, the ground select lines being spaced from each other in the bit line direction and collectively covering the array width,
wherein the number $N_{GSL}$ of the ground select lines covering the array width is different from both the number of string select lines $N_{SSL}$ covering the array width and the number of word lines $N_{WL}$ covering the array width.

9. The memory device of claim 8, wherein the number of string select lines $N_{SSL}$ covering the array width is greater than the number $N_{GSL}$ of the ground select lines covering the array width.

10. The memory device of claim 8, wherein the number $N_{GSL}$ of the ground select lines covering the array width is greater than the number $N_{WL}$ of word lines covering the array width.

11. The memory device of claim 8, wherein the pillars are arranged into $N_P$ rows spaced perpendicularly to the bit line direction, and covering the array width,
and wherein the number $N_P$ of rows of pillars is different from the number $N_{GSL}$ of the ground select lines covering the array width, is different from the number of string select lines $N_{SSL}$ covering the array width, and is different from the number of word lines $N_{WL}$ covering the array width.

12. The memory device of claim 11, wherein the number $N_P$ of rows of pillars is greater than the number of string select lines $N_{SSL}$ covering the array width.

13. The memory device of claim 12, wherein the number of string select lines $N_{SSL}$ covering the array width is greater than the number $N_{GSL}$ of the ground select lines covering the array width.

14. A memory device comprising:
a plurality $N_P$ of strings of series-connected memory cells, each of the strings having an equal number $N_C > 1$ of the memory cells, each of the strings further having a string select gate and a ground select gate series-connected at opposite ends of the string, each of the memory cells and each of the string select gates and each of the ground select gates having a respective control gate electrode;
a first plurality of separate word line conductors, each i'th one of the word line conductors being connected to the control gate electrode of a corresponding i'th one of the memory cells in all of the strings in the plurality of strings;
a plurality of $N_{SSL}$ of separate string select line conductors, each j'th one of the string select line conductors being connected to all the control gate electrodes of all the string select gates in a corresponding j'th distinct non-null subset of the string select gates; and
a plurality $N_{GSL}$ of separate ground select line conductors, each k'th one of the ground select line conductors being connected to the control gate electrode of all the ground select gates in a corresponding k'th distinct non-null subset of the ground select gates,
wherein the number $N_{SSL}$ of string select line conductors in the plurality of string select line conductors is different from the number $N_{GSL}$ of ground select line conductors in the plurality of ground select line conductors.

15. The memory device of claim 14, wherein the number $N_{SSL}$ of string select line conductors in the plurality of string select line conductors is greater than the number $N_{GSL}$ of ground select line conductors in the plurality of ground select line conductors.

16. The memory device of claim 15, wherein the number $N_{SSL}$ of string select line conductors in the plurality of string select line conductors is less than nine times the number $N_{GSL}$ of ground select line conductors in the plurality of ground select line conductors.

17. The memory device of claim 14, further comprising:
a second plurality $N_{P2}$ of second strings of series-connected memory cells, each of the second strings having the number $N_C$ of the memory cells, each of the second strings further having a second string select gate and a second ground select gate series-connected at opposite ends of the string, each of the memory cells and each of the string select gates and each of the ground select gates in the second plurality of strings having a respective control gate electrode;
a second plurality of separate second word line conductors, each of the second word line conductors being connected to the control gate electrode of a corresponding one of the memory cells in all of the strings in the second plurality of strings, the second word line conductors being separate from the word line conductors in the first plurality of word line conductors;
a second plurality of $N_{SSL2}$ of separate second string select line conductors, each of the second string select line conductors being connected to all the control gate electrodes of all the string select gates in a corresponding distinct non-null subset of the second string select gates; and a second plurality $N_{GSL2}$ of separate second ground select line conductors, each of the second ground select line conductors being connected to the control gate electrode of all the ground select gates in a corresponding distinct non-null subset of the second ground select gates, wherein the number $N_{SSL2}$ of second string select line conductors in the plurality of second string select line conductors is different from the number $N_{GSL2}$ of second ground select line conductors in the second plurality of ground select line conductors.

18. The memory device of claim 17, wherein $N_{SSL2}=N_{SSL}$ and $N_{GSL2}=N_{GSL}$.

* * * * *